(12) United States Patent
Zhang et al.

(10) Patent No.: US 10,712,759 B2
(45) Date of Patent: Jul. 14, 2020

(54) SYSTEM AND METHOD FOR ENHANCING BANDWIDTH OF LOW-DROPOUT REGULATORS USING POWER TRANSMISSION LINES FOR HIGH SPEED INPUT OUTPUT DRIVERS

(71) Applicant: Georgia Tech Research Corporation, Atlanta, GA (US)

(72) Inventors: David Chong Zhang, Atlanta, GA (US); Arijit Raychowdhury, Atlanta, GA (US); Madhavan Swaminathan, Marietta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/884,471

(22) Filed: Jan. 31, 2018

(65) Prior Publication Data
US 2019/0235545 A1    Aug. 1, 2019

(51) Int. Cl.
*G05F 1/575*    (2006.01)
*H05K 1/02*    (2006.01)

(52) U.S. Cl.
CPC ........... *G05F 1/575* (2013.01); *H05K 1/0237* (2013.01)

(58) Field of Classification Search
CPC .......... G05F 1/56; G05F 1/575; H05K 1/0237
USPC ....................................................... 323/280
See application file for complete search history.

(56) References Cited

U.S. PATENT DOCUMENTS

| 2007/0071112 A1* | 3/2007 | Gattani | H04L 25/0272 375/257 |
| 2007/0279024 A1* | 12/2007 | Falvey | H02M 3/158 323/280 |
| 2017/0125380 A1* | 5/2017 | Han | H01L 23/5386 |

OTHER PUBLICATIONS

Rouse, Margaret, "WhatIs.com," Definition of "Clean Electricity," https://whatis.techtarget.com/definition/clean-electricity (Year: 2013).*

* cited by examiner

*Primary Examiner* — Nguyen Tran
*Assistant Examiner* — Monica Mata
(74) *Attorney, Agent, or Firm* — Smith, Gambrell & Russell, LLP

(57) ABSTRACT

Power supply rejection (PSR) peaking in Low Dropout (LDO) voltage regulators can lead to reduced bandwidth and efficiency. The present invention is directed to a new design method by combining power transmission lines (PTL) with LDOs for enhancing its bandwidth and efficiency. This approach is applicable for LDOs regulating high speed I/O drivers. The PTL combined with decoupling capacitors on the package or board are used to mitigate the PSR peaking. This methodology is demonstrated using printed circuit board test vehicles with off-the-shelf components. When compared to conventional approaches, the PTL solution showed ~80% lower power supply noise.

17 Claims, 13 Drawing Sheets

SYSTEM AND METHOD FOR ENHANCING BANDWIDTH OF LOW-DROPOUT REGULATORS USING POWER TRANSMISSION LINES FOR HIGH SPEED INPUT OUTPUT DRIVERS

BACKGROUND OF THE INVENTION

Modern computer systems often include many voltage supplies. These are generated using DC/DC converters. A buck converter, a type of converter, can be used to step-down the voltage from a main DC supply. Depending on the voltage conversion ratio, buck converters, also referred to as Voltage Regulator Modules (VRM), have a power efficiency in the range of 70%-90%. To improve both power efficiency and voltage regulation, the recent trend is to move towards fully integrated voltage regulator (FIVR) modules to supply both the core and I/O circuits for System on Chip (SOC) applications. One implementation of a FIVR is to integrate the buck converter with SOC as a two chip solution on a package with passives such as inductors and capacitors either surface mounted or embedded in the package. Such two chip solutions can utilize a buck converter as the first chip and a Low Dropout regulator (LDO) as the second chip.

To ensure fine grained power management with fast transient response, LDOs are integrated in the SOC in close proximity to the load. Several LDOs integrated in the SOC are used to provide voltage regulation for both the core (i.e., the main bulk of the digital logic circuit with higher power consumption but usually operating at a lower frequency) and the I/O circuits. Voltage from the buck converter is supplied to the LDOs using voltage and ground planes in the package and/or printed circuit board (PCB).

Often times, voltage islands are used to separate the core and I/O power distribution to minimize noise coupling between the two. One limitation of the LDOs is the power supply rejection (PSR) peaking that occurs when its regulating feedback loop gain reaches 1 or 0 dB. Around this frequency, the PSR of the LDO degrades, resulting in power supply noise passing through the LDO from its input to its output, which connects to the power supply nodes of I/O drivers or other types of loads through the power delivery network (PDN), without impediment. Hence, it is important to keep power supply noise low by controlling the impedance at the input of the LDO in this frequency range. Unfortunately, for typical LDOs, the PSR peaking occurs in the 50 MHz-100 MHz frequency range, in where the chip-package or board anti-resonances also occur. An anti-resonance means a high impedance peak. A combination of ineffective noise rejection capability of the LDO due to PSR peaking and large package/board impedances can reduce the bandwidth of the LDO regulator leading to excessive power supply noise coupling from the input to the output of the LDO. A common way to improve PSR is by increasing the voltage dropout from the LDO input to the output so less noise voltage gets through to the output. However, this method also implies more power is dissipated in the LDO by the high dropout voltage causing decreased LDO efficiency. This is especially the case for LDO regulators used for I/O drivers.

Therefore, there is a need to enhance the bandwidth of the LDO to provide clean power to I/O drivers, while maintaining or improving the overall energy efficiency of the power delivery network that includes LDOs.

SUMMARY OF THE INVENTION

In an aspect, the invention is directed at a system and method that supplies power to I/O drivers efficiently with a reduction in power supply noise and an increase in energy efficiency as compared to the conventional power delivery method of using power and reference/ground planes. In an aspect, the I/O drivers can include high speed I/O drivers. In an aspect, the system utilizes setup found on SOCs to regulate the power to I/O drivers. In an aspect, the system includes a combination of a Voltage Regulator Module (VRM) with a Low Dropout (LDO) regulator connected in series with one another, for the LDO to deliver power to I/O drivers. In an aspect, the VRM and LDO can utilize a decoupling capacitor and a one dimensional Power Delivery Network (PDN). In an aspect, the PDN utilizes power transmission lines (PTL) instead of power planes to deliver power to I/O drivers. In such aspects, the PTL, in combination with a capacitor, both placed between the voltage regulator modules VRM and the LDO regulator, can be used to create a low impedance profile at the input of the LDO in the frequency band that the LDO's intrinsic power supply rejection (PSR) is deficient in rejecting noise so as to enhance the effective noise-rejection bandwidth of the LDO. Therefore, the LDO is able to deliver clean power to the power supply terminals of the I/O drivers while maintaining energy efficiency.

PTLs, unlike power/ground planes, are controlled-impedance structures that can be used for power delivery in electronic systems. The PTL can include a micro-strip, a strip line structure, or other types of impedance controlled transmission line structure. In an aspect, a micro-strip styled PTL can include a narrower thin power trace and a reference plane situated in an adjacent layer in the PCB or package substrate stackup. In such instances, the power trace is used to deliver current to the load while the reference plane serves as the current return path. In an aspect, PLTs reduce power supply noise for I/O drivers by eliminating return path discontinuities, minimizing coupling in mixed signal circuits, and significantly reducing the coupling between signal and power delivery networks in printed circuit boards.

This summary does not limit the scope of the claimed subject matter. Furthermore, the claimed subject matter is not constrained to the limitations that solve any or all disadvantages noted in any part of this disclosure. Features, aspects and advantages of the present invention are understood with reference to the following description, appended claims and accompanying figures.

DETAILED DESCRIPTION OF THE INVENTION

In the following detailed description of the preferred embodiments, reference is made to the accompanying drawings, which form a part hereof, and within which are shown by way of illustration specific embodiments by which the invention may be practiced. It is understood that other embodiments may be utilized and structural changes may be made without departing from the scope of the invention.

Figure 1:
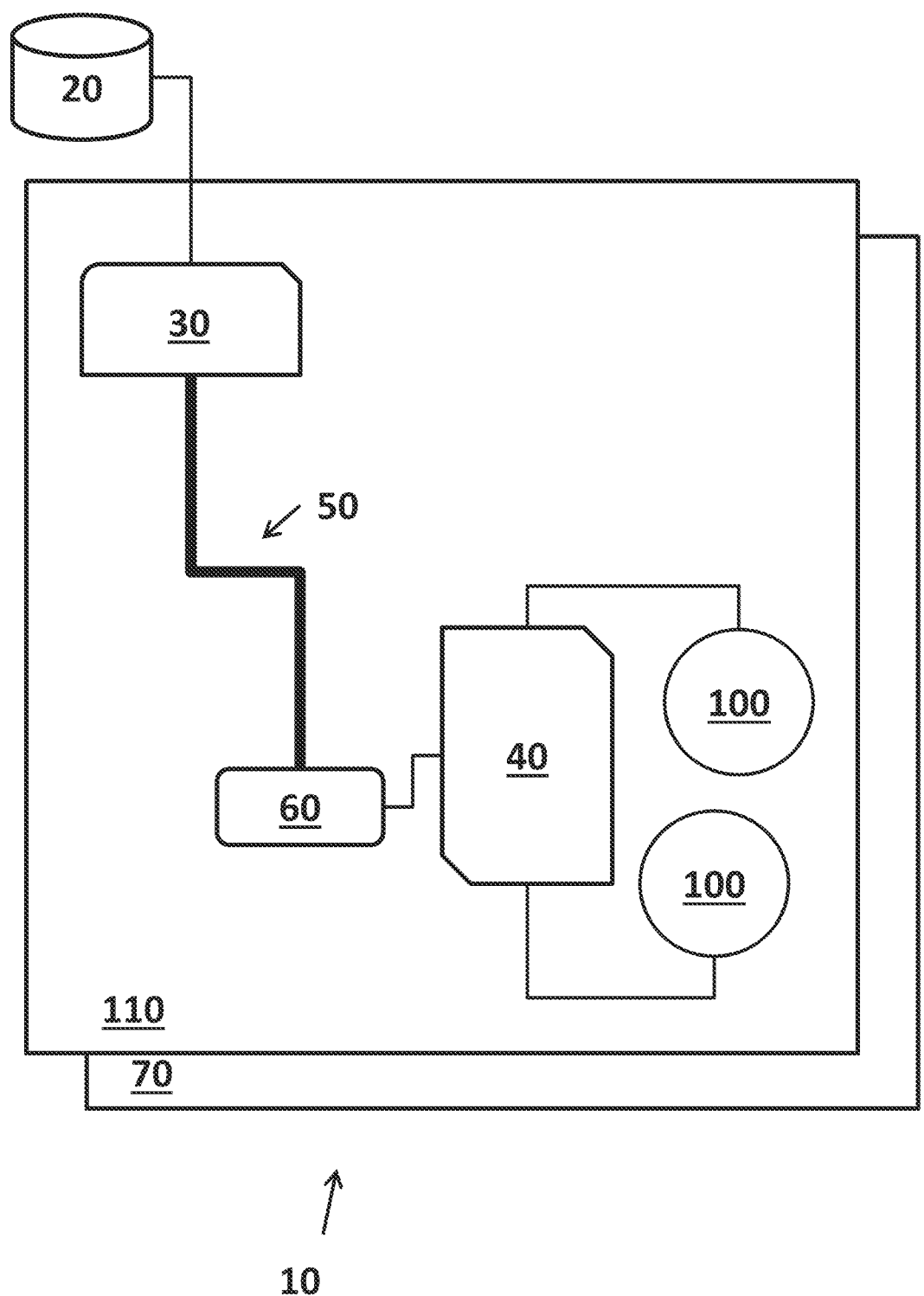
FIG. 1 is a schematic representation of a two-chip voltage regulator according to an aspect of the present invention.

In an aspect, the present invention is aimed at a system and method of providing I/O circuits with clean power. In an aspect, the I/O circuits include high-speed I/O circuits. FIG. 1 illustrates an example of the I/O power supply system 10 according to an aspect of the present invention. In an aspect, the power supply system 10 is configured to provide a high energy conversion efficiency, small power supply noise (i.e., good power integrity), less common mode noise, a good power supply rejection, increase the bandwidth of certain components (e.g., a LDO), and produce a higher signal integrity. In an aspect, the power supply system 10 can be contained within a SOC application that provides power to I/O drivers 100. In an aspect, the power supply system 10 can be found on a substrate 110 within a package or in a printed circuit board (PCB) design.

The power supply system 10 is configured to provide power from a power source 20 to the I/O drivers 100. In an aspect, the power source 20 can include another VRM, a battery, or an AC to DC converter. In an aspect, the power supply system 10 utilizes a combination of a Voltage Regulator Module (VRM) 30, a Low Dropout voltage regulator (LDO) 40, a Power Delivery Network (PDN) 50, a capacitor 60, and a reference/ground plane 70 to provide the power to the I/O driver 100(s). Through the combination of these components, the power supply system 10 is able to provide the benefits discussed above.

In an aspect, the VRM 30 reduces the voltage from the power source 20 for use by the I/O driver(s) 100. The VRM 30 utilized by the power supply system 10 includes VRMs 30 known in the art. In an aspect, the VRM 30 can be purchased off the shelf. In the power supply system 10, the VRMs 30 primary function is to step down the voltage from the power source 20 before delivery to the LDO 40. In an exemplary aspect, the VRM 30 comprises a buck converter 30. However, in other aspects, VRMs 30 can include other components capable of functioning as a VRM.

The VRM 30 reduces the voltage from the power source 20 before being supplied to the LDO 40, which ultimately delivers the current to the I/O driver(s) 100. The LDO 40 employed by the power supply system 10 can include any LDO that is known in the art. In an aspect, the LDO 40 includes an op-amp, a Q1 power transistor, R1 and R2. In an aspect, the LDO 40 utilizes its intrinsic PSR mechanism to ensure that the LDO 40 can effectively reject a large ripple at its input and allow as little amount of ripple to be passed to its output to the I/O driver(s) 100. In an aspect, other components are utilized with the LDO 40 to bring down the noise level in the PSR peaking region of the LDO 40 to the similar level of the rest of the frequency spectrum with good PSR. In addition, the LDO 40 is configured to reduce dropout voltage from its input to its output as much as possible in order to maintain a high energy conversion efficiency. In an aspect, the energy conversion efficiency of the LDO 40 is dependent on use, but can be determined from the ratio of output voltage over input voltage, discussed in more detail below.

The PDN 50 is used to carry current from the VRM 30 to the LDO 40. As shown in FIGS. 1-3a, the VRM 30 and the LDO 40 are connected to one another in series by the PDN 50. In an aspect, the PDN 50 is used to connect the VRM 30 and LDO 40 only to the I/O drivers 100. In such aspects, the PDN 50 is not connected to core circuits given the power needs of core circuits. In an aspect, the PDN 50 is a single dimension PDN 50. In such aspects, the single dimension PDN 50 can include a Power Transmission Line (PTL) 50. The PTL 50 can include a micro-strip, a strip line structure, or other types of impedance controlled transmission line structure. In an aspect, a micro-strip styled PTL 50 can include a narrower thin power trace and a reference plane 70 situated in an adjacent layer in the PCB or package substrate stackup. In such instances, the power trace 50 is used to deliver current to the load while the reference plane 70 serves as the current return path. The PTL 50, with the reference plane 70, can be used to replace voltage planes when possible.

The PTL 50 has various characteristics that can be controlled in connection with the LDO 40 that can increase the overall efficiency of the power supply system 10 as well as to control the IR drop of the system 10. In a specific aspect, by tuning various parameters of the PTL 50, the desirable DC resistance of the PTL 50 necessary to optimize overall system energy efficiency, including the efficiency of the LDO 40, can be set. In an aspect, the parameters can include, but are not limited to the length (Len), width (W), and thickness (T). In some instances, the thickness of the PTL 50 can be adjusted, but in most cases the thickness cannot be changed. In another aspect, the resistivity of the PTL 50 can be changed, but since resistivity is a material property, in most cases it cannot be changed.

In another aspect, controlling the length (Len), width (W), and dielectric thickness of the PTL 50 can control the inductance (L) of the PTL 50 to ensure low impedance in the PSR peaking range. In such aspects, a capacitor 60 can be used in connection with the PTL 50 in order to create a low-impedance null, or resonance point, which can lead to low impedance in the PSR peaking region of the LDO 40 at the LDO input. By adding a capacitor 60 to the PTL 50, a dominant impedance peak, or anti-resonance point, is also created. In such aspects, a capacitor 60 is selected that when combined with the PTL 50, the impedance is kept low in the PSR peaking region when the LDO 40 peaks (See region 1 of FIG. 4) while keeping any anti-resonance peak that occurs as a result of the combination of the inductance of the PTL 50 and the capacitor 60 away from the normal operating frequency range. In an aspect, if a single capacitor 60 is not sufficient to push away anti-resonance peaks, additional capacitors 60 can be utilized. In an aspect, a simulation tool can be utilized to determine the right combination of capacitor(s) with the PTL 50.

In an aspect, the system 10 is configured to have low impedance in the PSR peaking region and keep anti-resonances out of any other sensitive frequency regions, especially in the operating frequency of the system 10. In an aspect, the frequency of the anti-resonance peak can be denoted as $f_{anti\text{-}resonance}$. If the frequency spectrum of the power supply noise is outside of the PSR peaking region, the noise rejection mechanism of the LDO 40, which is contributed by the internal self-regulating op-amp, will take effect and suppress the noise. On the other hand, if the spectrum of the high noise current happens to be in the PSR peaking region, the noise rejection ability of the LDO 40 would be ineffective, and the op-amp cannot reject the noise at the input. However, the combination of the PTL 50 with the input capacitance would present low impedance at the input of the LDO 40, resulting in low noise voltage at the input of the LDO 40.

As discussed above, the power system 10 can include a reference or ground plane 70. In an aspect, the reference plane 70 and the PTL 50 are on different adjacent layers of the substrate 110 or PCB, with the reference plane 70 serving as a current return path. By having the PTL 50 and signal lines referenced to the same reference plane 70, an uninterrupted current return path occurs regardless of data transition direction, improving signal and power integrity of the system 10 (See FIG. 10). While it is possible to determine/customize characteristics of the LDO 40, and its PSR, an aspect of the present invention is to determine the appropriate characteristics of the PDN 50, including a PTL 50 in connection with a capacitor 60, to create a very low impedance in the PSR peaking region at the LDO input with knowledge of the characteristics of the LDO 40. These and other characteristics, especially for the PDN 50, and capacitor 60, are discussed in more detail below.

In an aspect, the LDO 40 is configured with emphasis on its bandwidth, Power Supply Rejection (PSR), efficiency, etc. In most cases, these characteristics are known. For example, consider FIG. 3(*a*) where the buck converter supplies voltage to the LDO through a PDN. The LDO regulates the voltage at its output, $V_{OUT}$. The output of the LDO is connected to a load commonly represented by a resistor and a capacitor connected in parallel. In an aspect, $V_{IN}$ and $V_{OUT}$ contain both DC and small signal AC components corresponding to the DC voltage and voltage ripple, respectively. In an aspect, the PSR for the LDO regulator can be defined as:

$$PSR = \frac{\partial v_{OUT}}{\partial v_{IN}} \equiv \frac{v_{out}}{v_{in}} \quad (1)$$

In an aspect, $V_{in}$ and $V_{out}$ of Eq. (1) represent the small signal AC components only. For an LDO regulator, the goal, as discussed above, is to minimize PSR to ensure that the LDO can effectively reject a large ripple at the input and allow as little amount of ripple to be passed to its output.

Figure 3:
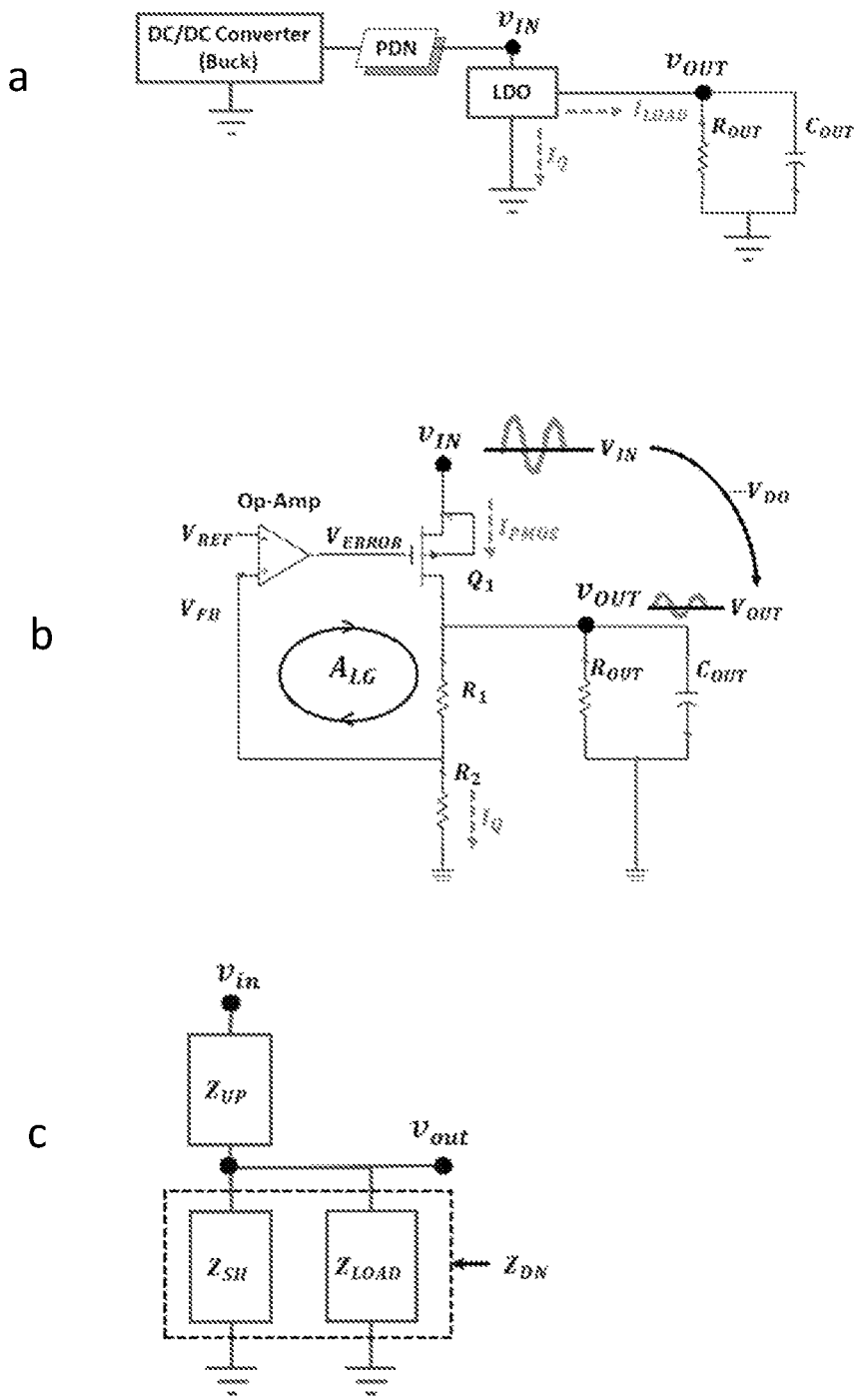
FIG. 3 is a schematic representation of (a) voltage distribution and regulation; (b) an LDO regulator circuit; and (c) a voltage-divider model according to an aspect of the present invention.

An example of an LDO regulator circuit is shown in FIG. 3(*b*) where a shunt-feedback loop is used for voltage regulation. To derive the PSR of the LDO regulator, a small-signal voltage divider model can be used, as shown in FIG. 3(*c*). Referring to FIG. 3(*b*), the error amplifier is used to sense and regulate the LDO regulator output by modulating the power transistor resistance of $Q_1$. To simplify the analysis, it is assumed that the negative feedback loop in the circuit can be represented as a two pole system, where the dominant internal pole ($P_1$) is at the gate of the PMOS transistor $Q_1$, and a second pole ($P_2$) is at the output of the LDO. In the circuit, the low frequency loop gain is $A_{LG0}$. The frequency dependent loop gain $A_{LG}$ in FIG. 3(*b*) can be written as:

$$A_{LG} = \frac{A_{LG0}}{\left(1 + \frac{s}{j2\pi P_1}\right) * \left(1 + \frac{s}{j2\pi P_2}\right)} \quad (2)$$

where $s=j\omega$ and $\omega$ is the angular frequency.

In FIG. 3(*c*), $Z_{UP}$ is the impedance between the input and output of the LDO given by:

$$Z_{UP} = \frac{v_{IN} - v_{OUT}}{i_{PMOS}} \quad (3)$$

where $I_{POS}$ is the current through the PMOS transistor of the LDO regulator. The shunt feedback impedance, $Z_{SH}$ in FIG. 3(*c*), which is the open-loop output impedance reduced by the loop gain assuming $V_{IN}$ is an AC ground can now be calculated as:

$$Z_{SH} = \frac{Z_{UP} \| Z_{LOAD} \| (R_1 + R_2)}{A_{LG}} \quad (4)$$

where $Z_{LOAD}$ is the parallel impedance of the output resistance and capacitance, $R_{LOAD}$ and $C_{LOAD}$, respectively. The pull down impedance $Z_{DN}$ can now be calculated as the total impedance from $V_{OUT}$ to AC ground, which is the impedance of $Z_{LOAD}$ and $Z_{SH}$ in parallel, as shown in FIG. 3(c). The PSR can now be derived as:

$$PSR = \frac{\partial v_{OUT}}{\partial v_{IN}} = \frac{Z_{DN}}{Z_{DN} + Z_{UP}} \quad (5)$$

From equation (5), to maintain good PSR, a high $Z_{UP}$ (impedance) to reject noise, and a low $Z_{DN}$ (pull down impedance) to bypass current ripple away from the LDO output is desired.

Figure 4:
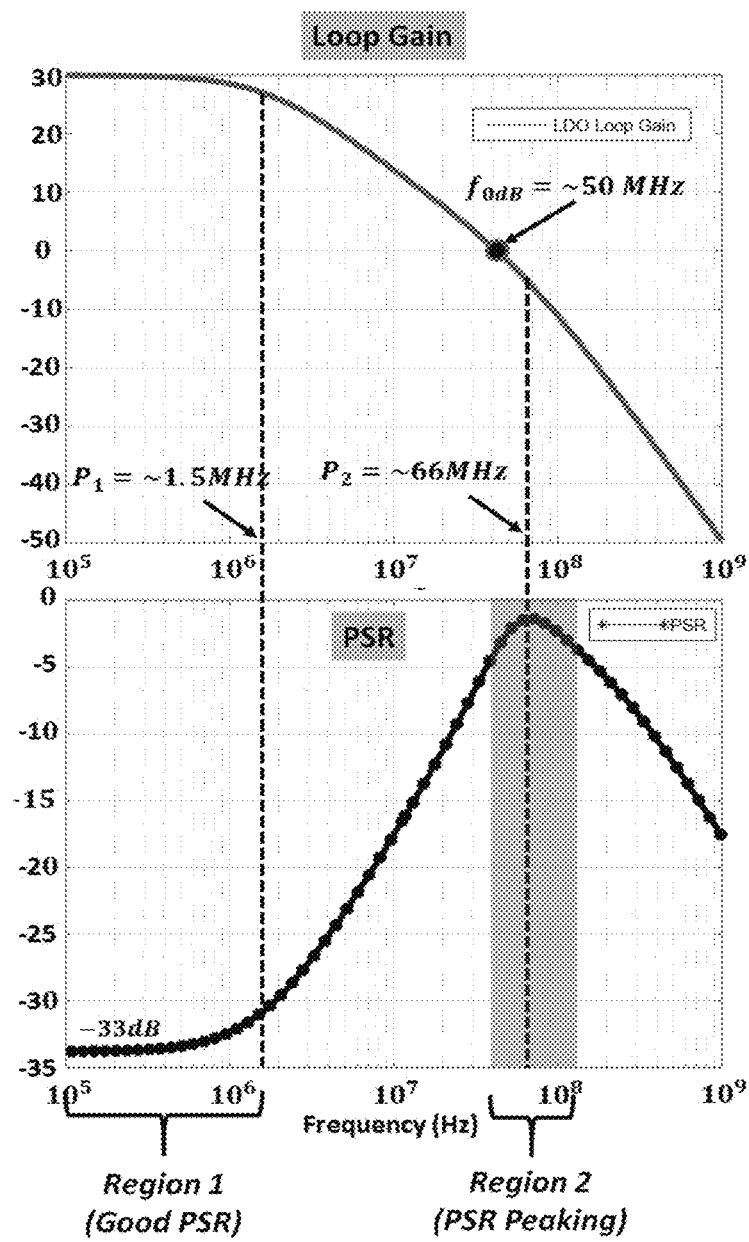
FIG. 4 is a graphical representation of a simulated loop gain and PSR of the LDO circuit according to an aspect of the present invention.

Using equations (2)-(5), the frequency response of the loop gain and PSR are shown in FIG. 4. As shown, the loop gain and PSR in dB is found on the y axis of the graphs, and frequency in Hz is found on the x-axis. Typical LDO design parameters used in obtaining the plot are found in Table I below.

TABLE I

Parameters Used to Generate PSR and Loop Gain of an LDO

| Parameter | Value | Unit |
|---|---|---|
| $V_{IN}$ | 1.2 | V |
| $T_{OUT}$ | 0.8 | V |
| $I_{PMOS}$ | 100 | mA |
| $R_{LOAD}$ | 8 | Ω |
| $C_{LOAD}$ | 300 | pF |
| $A_{LGO}$ | −30 | dB |
| $P_1$ | 10e6 | rad/sec |
| $P_2$ | 416e6 | rad/sec |

At lower frequency before pole $P_1$ (Region 1), the loop gain is at its maximum value, and the corresponding PSR is at its minimum, but with a −30 dB frequency. This corresponds to good power supply rejection where the PSR can be approximated as $Z_{DN}/Z_{UP}$ since $Z_{DN} \ll Z_{UP}$. In FIG. 4, pole $P_1$ occurs at ~1.5 MHz. Beyond pole $P_1$ the loop gain begins to decrease, thereby increasing impedance $Z_{SH}$. The PSR now begins to rise as shown in FIG. 4 until it peaks near the 0 dB frequency ($f_{0dB}$) at approximately 50 MHz. At this frequency, the LDO has its worst regulation, and the PSR can be approximated as $Z_{DN}/Z_{DN} \cong 1$ or 0 dB. From FIG. 4, the PSR has a large value in the 40 MHz to 100 MHz frequency range (Region 2). Between Region 1 and 2, the PSR is moderate. After the second pole $P_2$, which occurs at ~66 MHz, the impedance $Z_{SH}$ begins to decrease again causing the PSR to decrease. It is important to note that the PSR of the LDO circuit can be affected by other parasitics in the package and board. The important takeaway from the analysis is the frequency range of 40 MHZ-100 MHz, where the PSR peaking occurs, coincides with the package and board PDN anti-resonances in most systems. Therefore, this shows why the PDN in FIG. 3(a) needs to be co-designed with the LDO circuit to mitigate the PSR peaking effect.

Along with the PSR, another important parameter for the LDO circuit is its energy conversion efficiency ($\eta_{LDO}$). The efficiency can be defined as:

$$\eta_{LDO} = \frac{P_O}{P_O + P_{loss}} = \frac{I_{LOAD} * V_{OUT}}{(I_{LOAD} + I_Q) * V_{IN}} = \eta_I * \frac{V_{OUT}}{V_{IN}} \quad (6)$$

where $P_O$ and $P_{loss}$ is the output power and the power loss. $I_{LOAD}$ and $I_Q$ are the DC load and quiescent current as shown in FIG. 3(a), respectively, and $\eta_1$ is the current efficiency. Since the DC input and output voltages are related to each other by:

$$V_{IN} = V_{OUT} + V_{DO} \quad (7)$$

where $V_{DO}$ is the dropout voltage across the PMOS transistor, as shown in FIG. 3(b). This results in:

$$\eta_{LDO} = \eta_I * \frac{V_{OUT}}{V_{IN}} \approx \frac{V_{OUT}}{V_{IN}} = \frac{V_{OUT}}{V_{OUT} + V_{DO}} \quad (8)$$

where $\eta_1 \sim 1$ assuming quiescent current is negligible compared to $I_{LOAD}$.

From Eq. (8), the dropout voltage ($V_{DO}$) is an important parameter that determines the efficiency where a lower dropout voltage (or low $Z_{UP}$ impedance) always results in higher conversion efficiency. However, good PSR rejection for the circuit requires a large $Z_{UP}$ impedance. Hence, a design solution to handle the tradeoff between PSR and energy conversion efficiency is required. This is possible by co-designing the PDN and LDO circuit such that both good PSR and high efficiency are achievable.

Traditionally, DC/DC converter and LDO are connected through a power delivery network (PDN). Traditional PDNs consist of voltage/ground planes and bulk/decoupling capacitors. The goal of designing the PDN is to keep its impedance low in a wide frequency range. However, a combination of the plane and capacitor parasitics causes its impedance to increase. In addition, the interaction between the chip and package causes an increase in its impedance as well. Most of these high impedances occur in the frequency range of 40 MHz-100 MHz, a frequency range where the PSR peaking occurs for typical LDO regulators (Region 2 in FIG. 4).

Based on FIG. 3(a), a buck converter supplies power to the LDO circuit which in turn regulates the voltage for the I/O drivers, through a PDN. In general, prior art PDNs have impedance peaks in the 50 MHz frequency range. Since the impedance peak occurs due to the parallel resonance between the chip capacitance and package/PCB inductance, moving these impedances to lower or higher frequencies can be difficult. For example, any reduction in the inductance of the PDN to shift the impedance peak to higher frequencies can be challenging due to the limitations posed by the geometrical structures used in the package and PCB. Similarly, pushing the impedance peak to lower frequency by increasing the capacitance on chip can be difficult as well.

Figure 5:
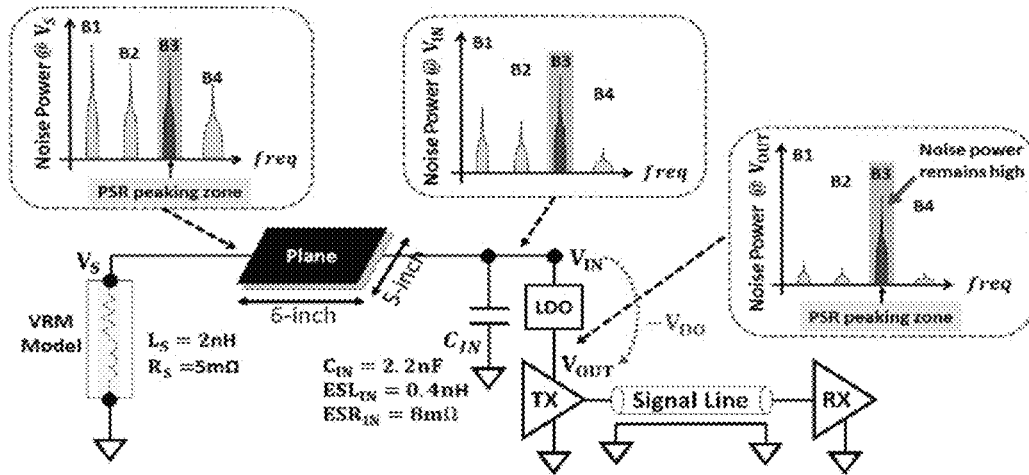
FIG. 5 is a schematic representation of plane based PDN architecture connection with the VRM and LDO and graphical representations of related noise power therein.
Figure 6:
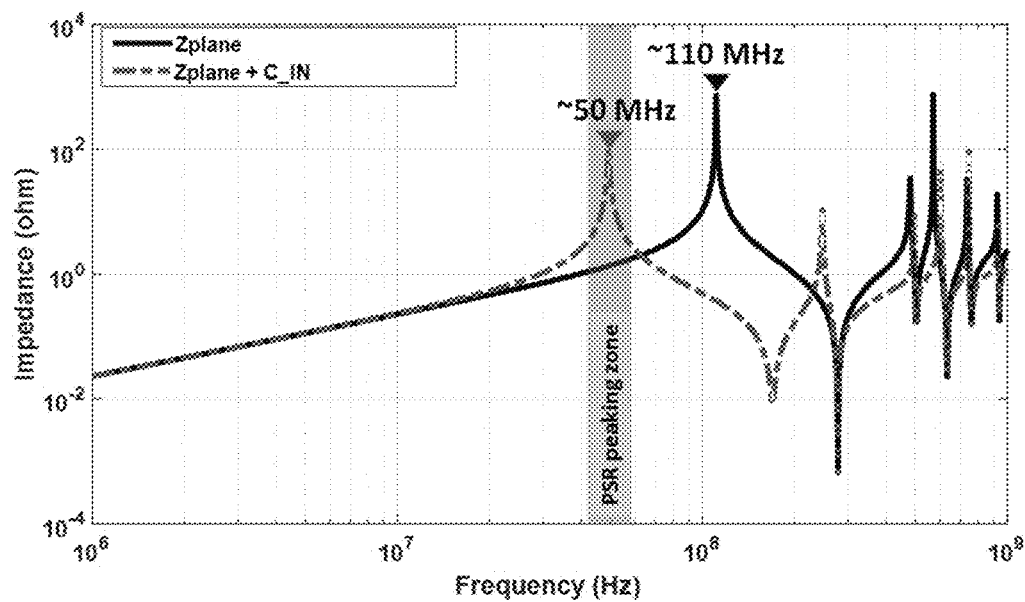
FIG. 6 is a graphical representation of a plane self-impedance with and without decoupling capacitor according to an aspect of the present invention.

FIG. 5 illustrates a circuit utilizing a traditional PDN which captures the effect of the PDN impedance on the workings of an LDO. As shown, the circuit's voltage and ground planes, measuring 6"×5" and separated by 40 mil of FR-4 (dielectric constant is 4.5), are used in the PCB to connect the buck converter to the LDO circuit. The capacitor $C_{IN}$ in FIG. 5 creates a parallel resonance between the planes and the capacitor. The self-impedance at $V_{IN}$ looking towards the buck converter is constructed by adding the capacitor $C_{IN}$, which results in an impedance peak around 50 MHz so as to mimic the behavior of the PDN in realistic systems. The self-impedance at port $V_{IN}$ looking towards the buck converter is shown in FIG. 6 before and after placing the capacitor. As shown, the high impedance can be seen around 50 MHz where $C_{IN}$=2.2 nF with ESR=8 mΩ and ESL=400 pH has been used. In FIG. 5, the switching converter (shown as the VRM module) is represented using a simple series R-L circuit to capture its closed impedance, where $L_S=2$ nH and $R_S=5$ mΩ.

In an aspect, based on FIGS. 5-6, two sets of studies illustrate the effect of PDN impedance and DC resistance on overall energy conversion efficiency and PSR in the traditional PDN circuit utilizing voltage and ground planes. The testing set $V_{IN}=1.2V$ and that the quiescent current is negligible ($I_{LOAD} \cong I_{POS}=100$ mA). The noise current was assumed to be 5% of the load current at 5 mA. In FIG. 5, the noise power spectrum density in the PSR peaking region is represented by the shaded spike in frequency band B3 where noise in other bands (B1, B2, and B4) are outside of the PSR peaking region. The noise spectrum at the output of the LDO circuit can be high (B3), since the impedance of the PDN is high in this frequency range.

Using a plane resistance ($R_{DC\text{-}plane}$) of 5 mΩ, the LDO model shown in FIG. 5 has been used to calculate the performance of the LDO circuit. Table II lists the PSR and efficiency. $V_S$ is the sum of $V_{IN}$ and the voltage drop across the PDN due to the DC resistance. Two cases have been studied, as described below.

Case 1. LDO Dropout Voltage, VDO=0.4V

In the first study, the dropout voltage across the LDO PMOS transistor was set as 0.4V. For $I_{LOAD}=0.1$ A, the power absorbed by the PDN is $P_{PDN}=I^2_{LOAD}*R_{DC\text{-}plane}=50$ uW; the power loss due to the PMOS transistor is $P_{DO}=I_{LOAD}*V_{DO}=40$ mW and output power is $P_{OUT}=I_{LOAD}*V_{OUT}=80$ mW. Therefore, the input power is 50 uW+40 mW+80 mW=120.05 mW according to:

$$P_{IN}=(P_{PDN}+P_{DO})+P_{OUT}=P_{LOSS}+P_{OUT} \quad (9)$$

The energy conversion efficiency of the system is therefore:

$$\eta_{SYS} = \frac{P_{OUT}}{P_{IN}} = \frac{80}{120.5} = 66.6\% \quad (10)$$

The LDO power supply noise at node $V_{IN}$ in FIG. 5 can be calculated as:

$$V_{IN_{noise}}=Z_{IN}*I_{noise} \quad (11)$$

where $I_{noise}$ is the noise current, which is assumed to be 5 mA, and $Z_{IN}$ is 99.45Ω from the simulation results. Based on the LDO circuit model discussed above, the PSR was calculated as −2.07 dB with a resulting power supply noise at the output of the LDO circuit to be ~0.39V. The results of this case are shown in Table II below.

Case 2. VDO=0.5V

In this study, the PSR of the LDO circuit was improved by increasing the dropout voltage to 0.5V. As can be seen in Table II, the PSR improves by 16.6% to −3.65 dB, which was obtained by setting $V_{OUT}=0.7V$ in the simulated LDO model. The resulting power supply noise at the output of the LDO circuit is ~0.33V, which improved by 16.6% as compared to Case 1. However, due to the increased dropout across the PMOS transistor, the power efficiency reduces by 12.5% to 58.3% as compared to Case 1.

Hence, it is difficult to achieve high efficiency and low power supply noise at the output of the LDO circuit simultaneously, especially at frequencies where the PDN impedance peaks occur, as illustrated by the results in Table II. Utilizing a single dimension PDN like power transmission lines solves this problem, as described below.

Single Dimension Connector

Figure 2:
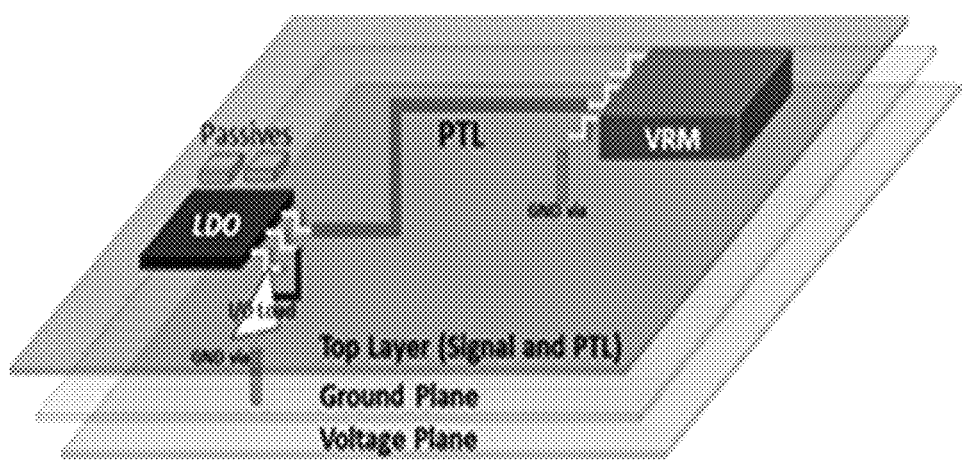
FIG. 2 is a schematic representation of a two-chip voltage regulator according to an aspect of the present invention.
Figure 7:
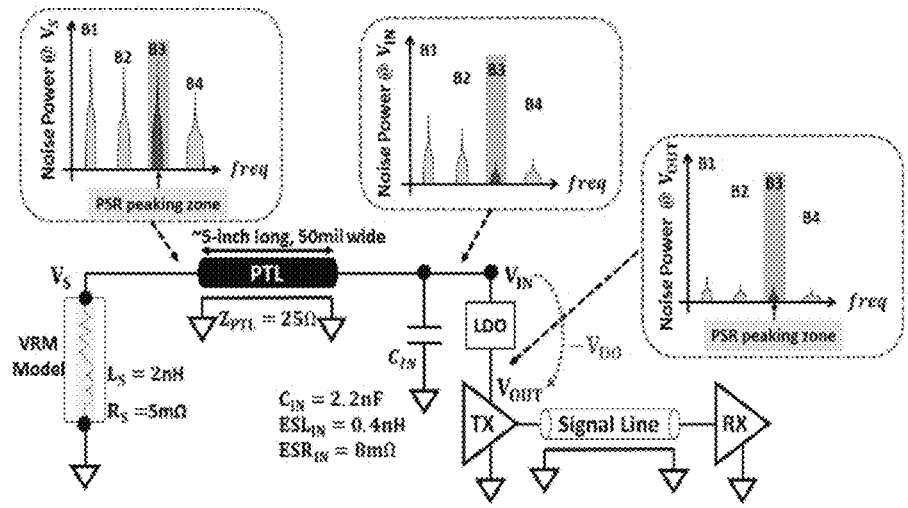
FIG. 7 is a schematic representation of the architecture to combine PTL with LDO and graphical representations of related noise power therein according to an aspect of the present invention.

As shown in FIG. 2, the PDN for the I/O circuits is separated from the core, with the voltage and ground planes used to distribute power to the core, and a narrow interconnection with a reference plane used to connect the buck converter to the LDO regulator for the I/O circuits. This is shown in FIG. 7, where the power transmission line (PTL) represents the narrow interconnection. The PTL is referenced to the ground plane used in the package and PCB to form a continuous current loop and represented as a microstrip line in FIG. 7. The architecture in FIG. 7 was simulated and compared to Cases 1 and 2 described above.

Figure 8:
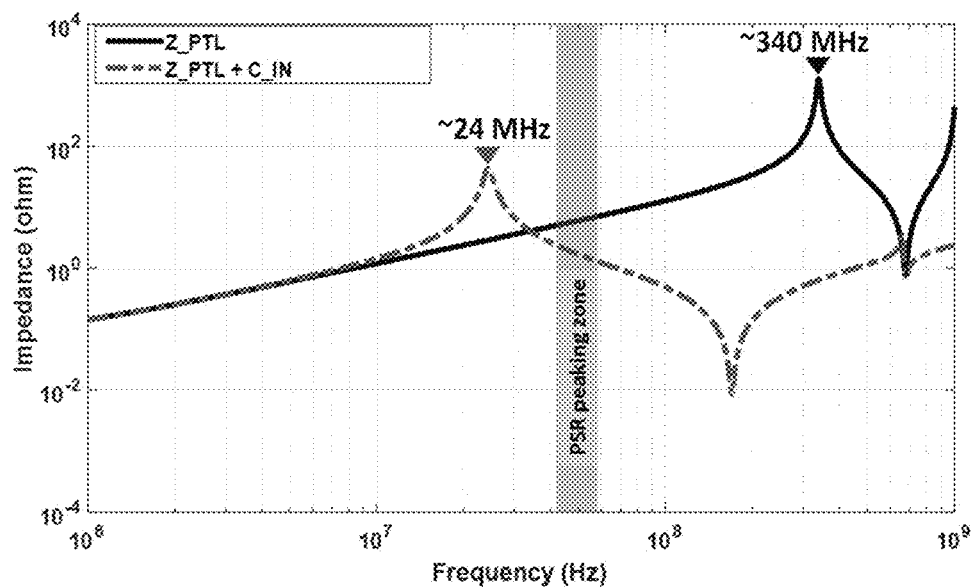
FIG. 8. is a graphical representation of the self-impedance for a PTL with and without decoupling capacitor according to an aspect of the present invention.

As an example, consider a PTL geometry that is 50 mil wide, 5 inch long, and with a dielectric thickness of 10 mil above a ground plane. The self-impedance of the PTL at $V_{IN}$ of the LDO circuit is shown in FIG. 8, which shows the frequency response is very inductive as compared to a typical PDN structure. Placing a capacitor at the $V_{IN}$ port of the LDO circuit, as shown in FIG. 7, results in an impedance peak due to the parallel anti-resonance between the PTL inductance and capacitor capacitance. We denote this peaking frequency as $f_{anti\text{-}resonance}$. By controlling the dimensions of the PTL and value of the capacitor, the position of the impedance peak can be tuned, thereby leading to low impedance in the PSR peaking region of the LDO circuit. This is illustrated in FIG. 8, where the same capacitor $C_{IN}$ (FIG. 5) is used in the circuit in FIG. 7, leading to an impedance peak at ~24 MHz. The resulting impedance around 50 MHz is small at ~1.68Ω. The effect of the small PDN impedance is shown in FIG. 7, where the noise spectrum density in the PSR peaking region shown as B3 is significantly attenuated at the output of the LDO circuit, leading to smaller power supply noise.

Unlike a typical PDN, PTLs are easy to design and tune. The following compares the response of the LDO circuit described in FIG. 7 with the two cases described earlier but with a lower drop out voltage to illustrate that both the efficiency and PSR can be improved using this architecture.

Case 3. VDO=0.3V

In FIG. 7, the dropout voltage was set to 0.3V across the PMOS transistor resulting in a worsening of the PSR to −0.405 dB according to the simulated LDO model by setting $V_{OUT}=0.9V$. However, since the self-impedance of the PDN, which is 1.68Ω, is much lower compared to the previous cases at around 50 MHz, the resulting power supply noise at the output of the LDO circuit is 8.04 mV, as represented by the significantly reduced noise power spike in B3 of FIG. 7 at the LDO out. As compared to Case 1, using a PTL reduces the power supply noise by 97.9%. Though the PTL has a higher simulated DC resistance (48.5 mΩ in this example), the overall energy conversion efficiency is 74.7%, an improvement of 12.1% as compared to Case 1 due to the lower dropout voltage. As can be seen from Table II, the results for Case 3 are much better as compared to both Cases 1 and 2 in terms of efficiency and power supply noise.

Therefore, co-designing the PTL with the LDO circuit leads to significant improvements in overall energy conversion efficiency and power supply noise are possible.

TABLE II

PSR and Energy Conversion Efficiency Comparison

Energy Conversion Efficiency Result

| Row# | | Case 1 Plane ($V_{DO}$ = .4 V) | Case 2 Plane ($V_{DO}$ = .5 V) | Case 3 PTL ($V_{DO}$ = .4 V) |
|---|---|---|---|---|
| 1 | $\eta_{SYS}$ (%) | 66.6% | 58.3% | 74.7% |
| 2 | $\eta_{SYS}$ | | −12.5% | 12.1 |

TABLE II-continued

PSR and Energy Conversion Efficiency Comparison

Energy Conversion Efficiency Result

| Row# | | Case 1 Plane ($V_{DO}$ = .4 V) | Case 2 Plane ($V_{DO}$ = .5 V) | Case 3 PTL ($V_{DO}$ = .4 V) |
|---|---|---|---|---|
| | Improvement PSR Result | | | |
| 3 | PSR Rejection (dB) | −2.07 | −3.65 | −0.405 |
| 4 | Impedance at LDO input $Z_{IN}$ @ 50 MHz, (Ω) | 99.45 | 99.45 | 1.68 |
| 5 | Noise at LDO output, $V_{OUT\_noise}$ (V) | 0.39 | 0.33 | 0.008 |
| 6 | Noise improvement | | 16.6% | 97.9% |

Design of Power Transmission Lines

Unlike power planes, power transmission lines (PTL) are easier to design. Since voltage and ground planes are 2D structures, they behave as a cavity resonator resulting in standing wave resonances along two dimensions. In contrast, PTLs are 1D structures and hence the standing wave resonances occur only along a single dimension. Since the PTL connects the buck converter to the input of the LDO circuit, the DC resistance of the PTL needs to be controlled to maximize system efficiency. In addition, the inductance of the PTL needs to be controlled to ensure that the parallel resonance between the PTL and capacitor leads to low impedance in the PSR peaking range. These can be managed by designing the PTL with suitable width (W), length (Len), and dielectric thickness (D).

For example, an LDO circuit with a dropout voltage of 0.2V, the DC drop across the PTL can be budgeted/assumed to be 2% of the dropout voltage, which translates to a system efficiency of ~80% for a 1V input. R can be determined from the following: R=V/I, where V is the budgeted allowable voltage drop across the PTL 50 and I is the load current through the PTL 50. For a load current of 0.1 A, the DC resistance of the PTL therefore needs to be 40 mΩ (0.2V*0.02)/0.1. This parameter, R, can be used to determine the W and Len of the PTL based on:

$$R = \rho \frac{Len}{W \times T} \quad (12)$$

Where ρ is the resistivity and T is the thickness of the line. Similarly, since the inductance of a micro-strip line can be approximated as:

$$L = 0.00508 * Len * \left( \ln\left(\frac{2 * Len}{W * D}\right) + 0.5 + 0.2235 * \left(\frac{W + D}{Len}\right) \right) \quad (13)$$

Depending on the inductance L required, the width (W), length (Len) and dielectric thickness (D) can be suitably adjusted. Inductance can be determined from the anti-resonance frequency as previously described, $f_{anti-resonance}$, at which the impedance peaks. The location of the anti-resonance frequency should be located outside of the PSR peaking region. The exact location can be determined through simulation via an iterative process based on the available capacitor value, device tolerance, allowed resistance of the PTL 50, etc., as mentioned above. With this knowledge, and the known capacitance (C) of the capacitor used, inductance (L) can be found by solving for L from equation (14) for $F_{anti-resonance}$ shown below:

$$f_{anti-resonance} = 1/(2\pi\sqrt{(LC)}) \quad (14)$$

Therefore, the design equations in (12) and (13) can be co-optimized to determine the optimum values for W, Len, and D that provides the lowest DC resistance and the desired inductance.

Figure 9:
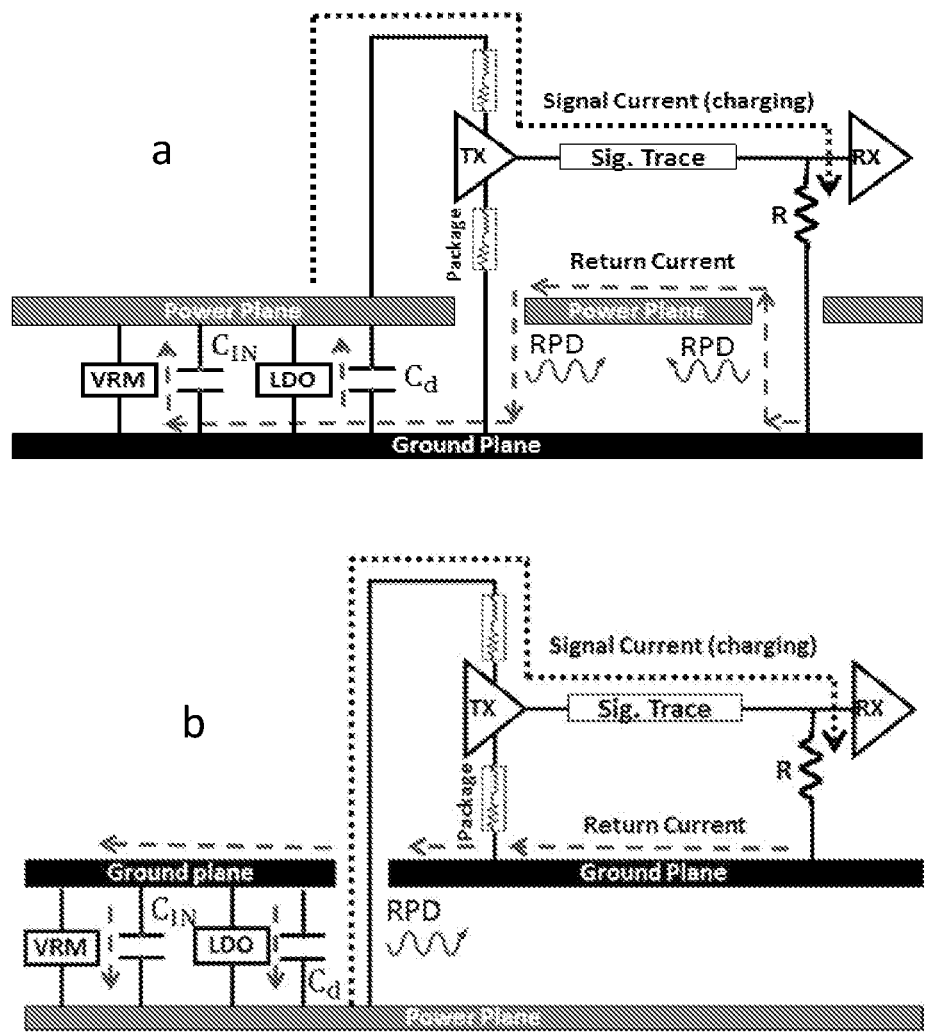
FIG. 9 is a schematic representation of a current return path during a low-to-high transition for signal line referenced to planes (a) voltage above ground plane and (b) ground plane above voltage plane.

Signal distribution networks in the package and PCB often incur return path discontinuities (RPD) due to the interruption in current return path of signal lines. RPDs can lead to significant signal integrity issues such as ground bounce, simultaneous switching noise, and crosstalk to name a few. When planes are used, irrespective of the signal referencing (signal referenced to voltage or signal referenced to ground), the interruption in the current path causes RPDs that can affect signal and power integrity. The source of these discontinuities are shown in FIG. 9 which shows the current path for the signal line as well as where the receiver (RX) is terminated by a resistor in parallel. In the discharging scenario, although not shown, RPDs can be expected if the return current transitions between inner planes.

Figure 10:
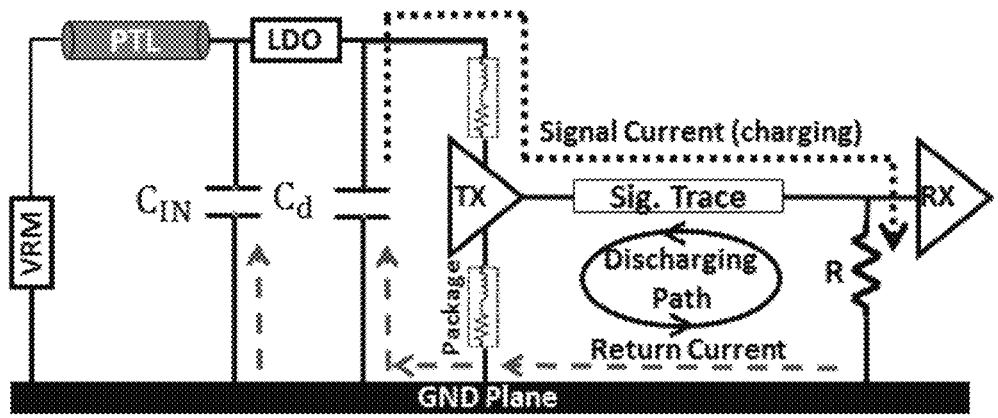
FIG. 10 illustrates a current path of a PTL during a low-to-high and high-to-low according to an aspect of the present invention.

In contrast, the signal trace in the construction of the PTL references to the ground plane. This eliminates the voltage plane for I/O circuits and hence inherently ensures an uninterrupted current return path regardless of data transition direction, as shown in FIG. 10. This significantly improves signal and power integrity in systems. Using PTLs to power I/O drivers improves eye height and jitter (e.g., over 15% in some cases over 35% in others), since any coupling between the signal and PDN is minimized. Hence, along with improving LDO efficiency and power supply noise, PTLs provide significant SI benefits as well.

Test Vehicle Design

The results discussed above were validated using PCB test vehicles with COTS components.

A. DESIGN OF PRINTED CIRCUIT BOARDS TEST VEHICLES

Three 4-layer PCBs were designed and fabricated. The first PCB design used PTL while the other two used power and ground planes to connect to the input of the LDO circuit. The layer assignments for all three boards are shown in TABLE III.

TABLE III

Test Vehicle PCB stack-up Information

| Test Vehicle | PTL | Plane: GP | Plane PG |
|---|---|---|---|
| Stack up | --SIG-- | --SIG-- | --SIG-- |
| | --GND-- | --GND-- | --PWR-- |
| | --GND-- | --PWR-- | --GND-- |
| | --SIG/PTL-- | --SIG-- | --SIG-- |

Figure 11:
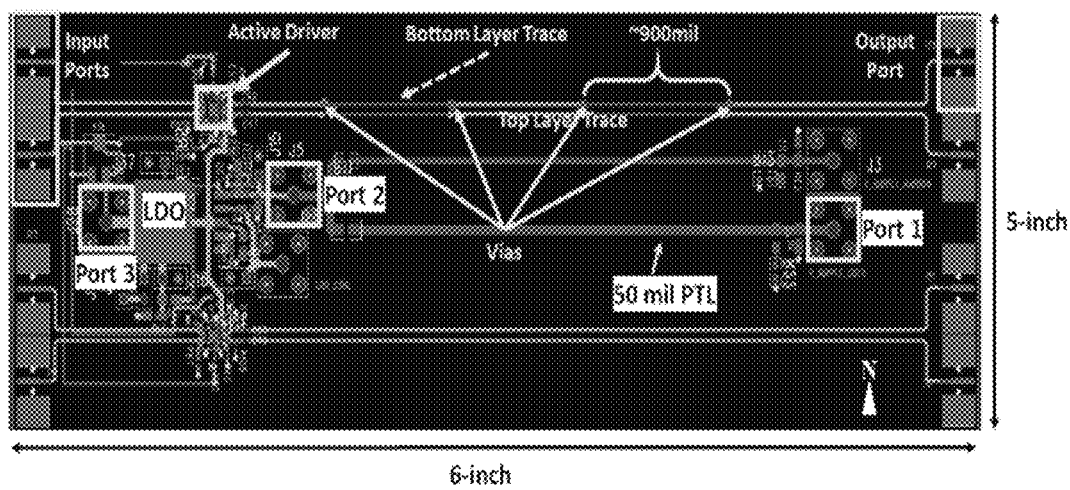
FIG. 11 is a representation of a PTL test vehicle according to an aspect of the present invention.

The PCBs using planes were categorized as GP (Ground-Power) and PG (Power-Ground). This was done to look at two scenarios where the signal line is either referenced to the ground or voltage plane. The PTL PCB had no inner power layers since the power was delivered using PTL which was routed on the bottom layer (See FIGS. 12-13). A 50-mil wide PTL was used to supply the LDO chip, where the PTL length was ~4.98 inches. The PTL PCB design layout is shown in FIG. 11 showing the critical components and dimensions. The PCB material information and dimensions are the same as discussed above for Case 3. The PCBs using planes had the same construction as FIG. 11 (except for the PTL) and are therefore not shown.

B. SCHEMATIC DESIGN AND PCB LAYOUT

Figure 12:
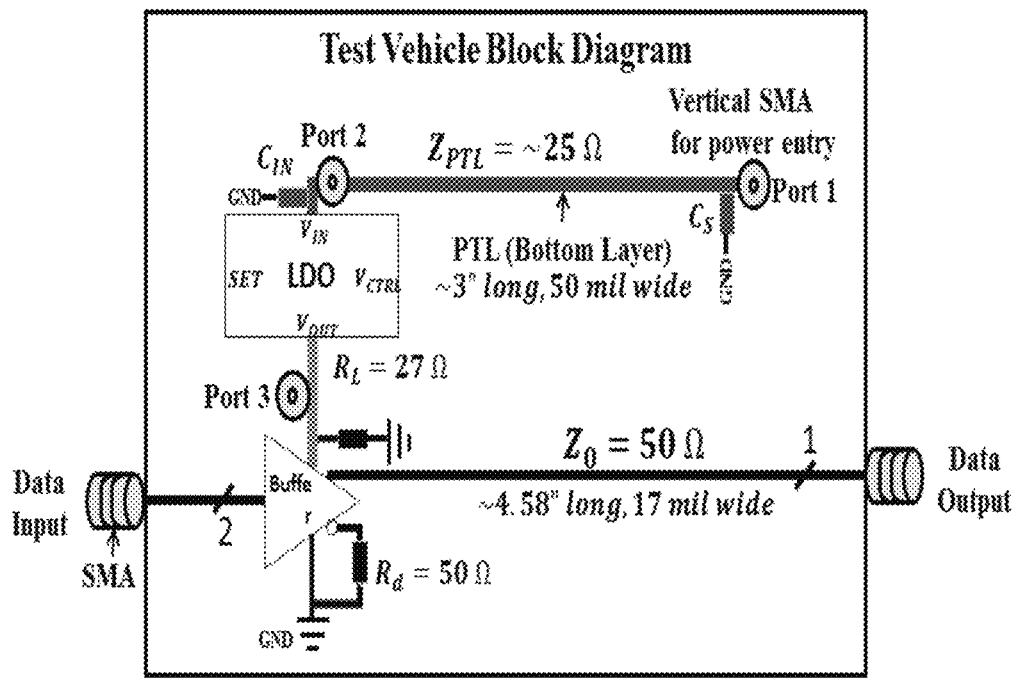
FIG. 12 is a schematic representation of a printed circuit board (PCB) with an PTL according to an aspect of the present invention.

Each test vehicle includes an LDO supplying two high speed I/O buffers and a 27Ω load resistor, $R_L$, as shown in FIG. 12. The buffers and LDO regulator were from On-Semiconductor (P/N: NBSG16VS) and Linear Technology (model number: LT3083), respectively.

The $V_{IN}$ pin in FIG. 12 represents the LDO power input which was connected to the power delivery network. The $V_{OUT}$ pin represents the power output and was connected to power various loads including the high speed buffers and the 27Ω load resistor, $R_L$. The $V_{CTRL}$ pin in FIG. 12 was decoupled using a 4.7 µF capacitor (not shown). The pin was connected to a resistor and bypassed by a capacitor (not shown) used to ensure the output was set to ~2.5V. Port 1 was bypassed using a 0603 1 µF capacitor, which was used for connecting to the external power supply source. The differential buffers were used as pseudo single ended transmitters.

Figure 13:
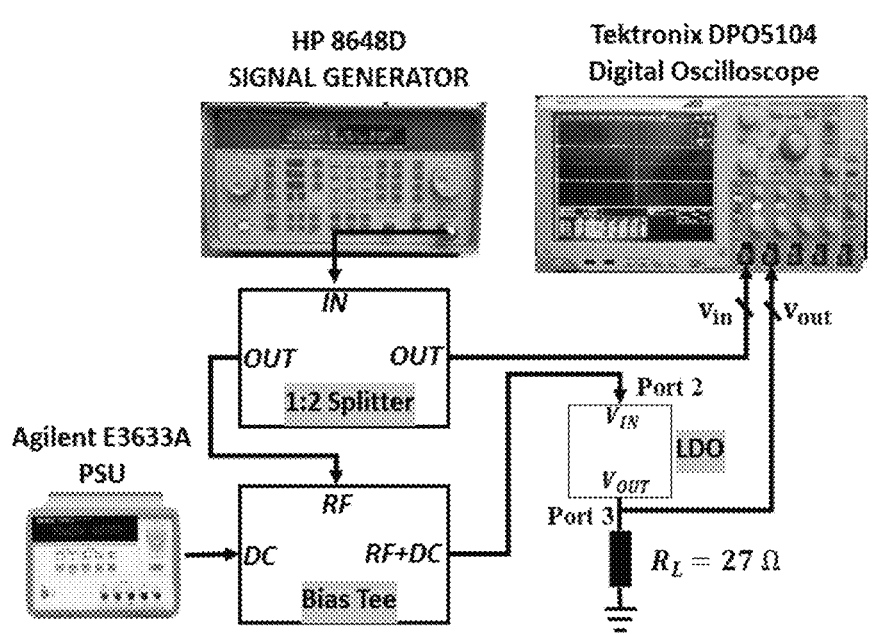
FIG. 13 is a schematic representation of the setup used to measure the PSR of the PTL of FIG. 11 according to an aspect of the present invention.

FIG. 13 shows the test setup used for measuring the PSR of the LDO chip. A signal generator was used as a noise source to generate a sinusoid. Its output was connected to the input of a 1:2 splitter. One output of the splitter was monitored using an oscilloscope. The other output was connected to the RF port of a 3-port Bias-Tee module. The DC port of the Bias-Tee was connected to an external power supply to bias the $V_{IN}$ pin of the LDO. The output of the Bias-Tee, which was the sum of the RF and DC inputs was then fed into the LDO input.

Figure 14:
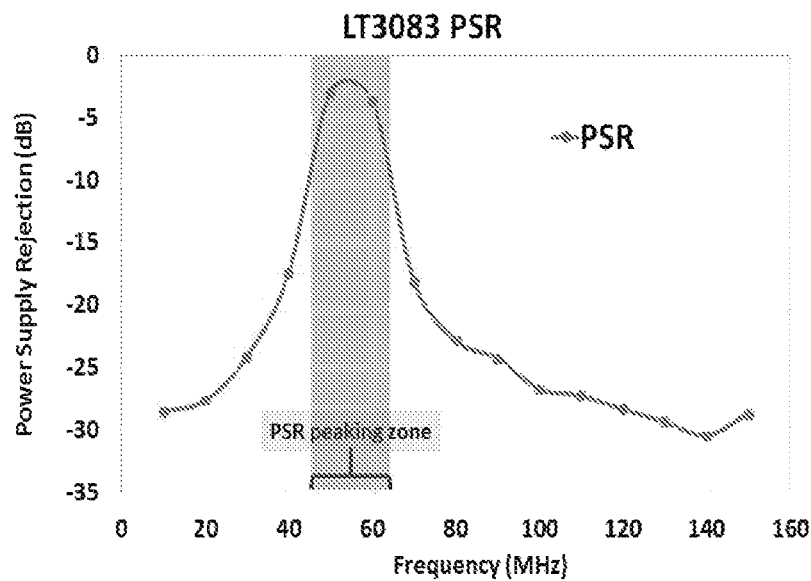
FIG. 14 is a plot graph representing the PSR in frequency domain of the measured power supply rejection of a LDO chip utilized in FIG. 13.

The LDO output voltage was set to 2.5V while driving a 27Ω resistor. Therefore, the load current was ~100 mA. As the frequency of the input sinusoid was varied from 10 MHz to 150 MHz with 10 MHz increments, the amplitude of the AC noise at the LDO output ($V_{OUT}$) was measured. The ratio of noise to ac input voltage ($V_{IN}$=100 mV) was used to obtain the PSR as a function of frequency, similar to (1). The PSR plot is shown in FIG. 14. As can be seen, the PSR of the LDO peaks in the region centered around 50 MHz, similar to FIG. 4. This measurement is the baseline measurement.

C. PSN UNDER STATIC LOAD

Figure 15:
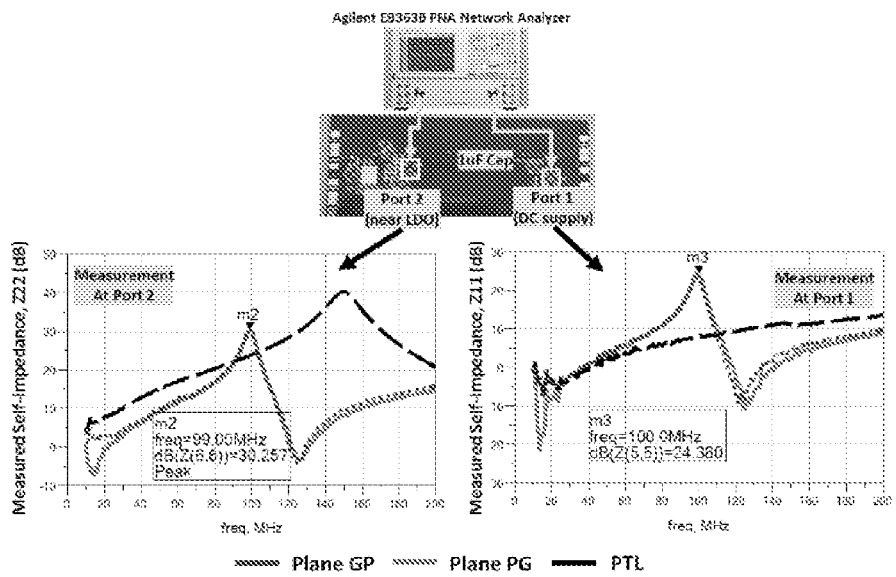
FIG. 15 illustrates a graphical representation of a self-impedance measurement of GP and PG planes and PTL at an LDO location (left plot) and at a DC supply port (right plot) according to an aspect of the present invention.

The impedance profile of the PDN for the three test vehicles were measured at port 1 and 2 using an Agilent® E8363B network analyzer. The test setup and measurement results are shown in FIG. 15. An impedance peak at ~100 MHz for both PG and GP PCBs at port 2 near the LDO chip can be seen, while this occurs at ~150 MHz for the PTL PCB.

Figure 16:
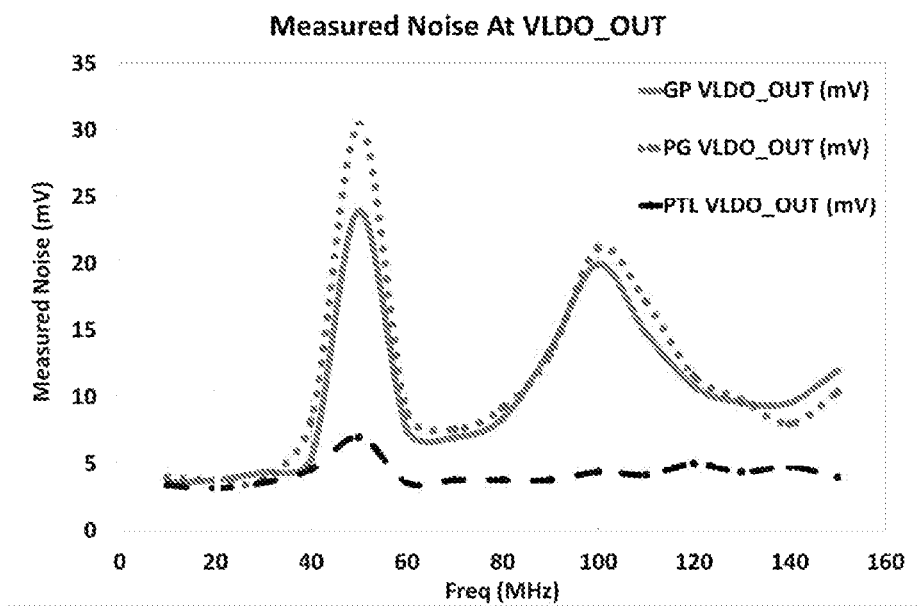
FIG. 16 is a graphical representation of comparison of measured noise at an LDO output when the noise source is approximately 100 mV P-P frequency from 10 MHz to 150 Mhz of the PTL and planes according to an aspect of the present invention.

For each test vehicle, an AC noise source was injected into port 1 with a ~100 mV sinusoid in the same aforementioned frequency range. The measured power supply noise at the LDO chip output for the plane and PTLPCBs are shown in FIG. 16.

Two noticeable noise surges were observed at around 50 MHz and 100 MHz region for GP and PG PCBs. The peaking at 100 MHz is due to the high self-impedance (FIG. 15). Though the impedance peaked at 150 MHz at port 2 for the PTL PCB, the impedance at port 1 is relatively low. Therefore, less noise appeared at port 2 after propagating through the PTL. Since the LDO chip has good PSR at 150 MHz, the impedance peak at 150 MHz is not an issue. However, the second peaking at ~50 MHz for the plane PCBs was a concern due to the ineffectiveness of PSR of the LDO at ~50 MHz to reject it (FIG. 14), leading to larger noise at the LDO chip output.

Figure 17:
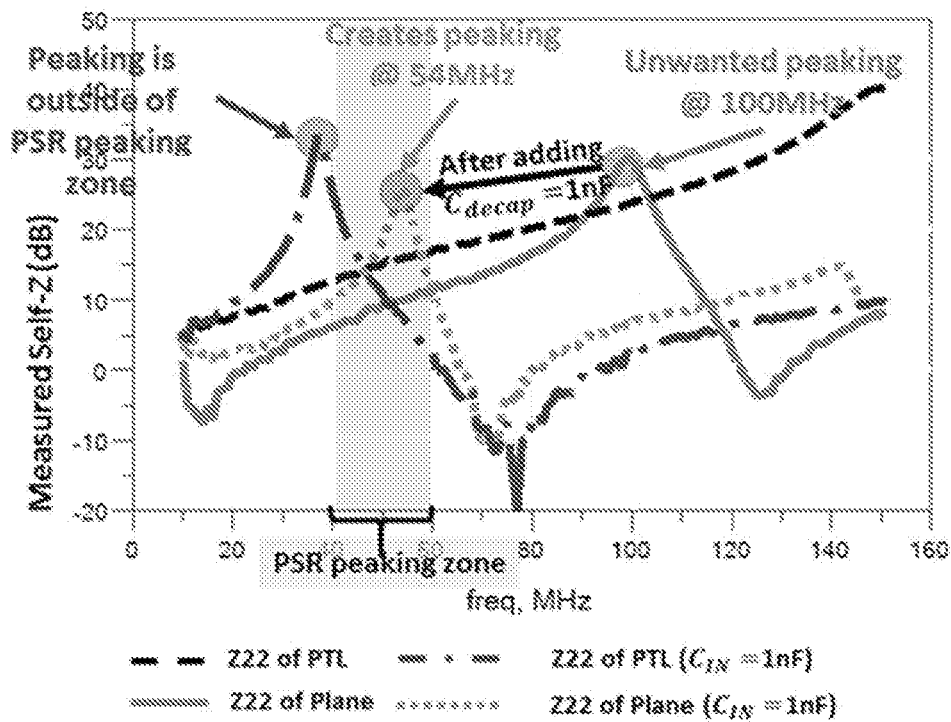
FIG. 17 is a graphical representation of a comparison of measured self-impedance at a port near the LDO input after adding a 1 nF decoupling capacitor at the LDO Vin pin of PTL and planes according to an aspect of the present invention.

To bypass the 100 MHz noise, a 1 nF capacitor was added near the LDO input pin. The self-impedance at port 2 near the LDO $V_{IN}$ pin was re-measured and is shown in FIG. 17. The solid curve represents the self-impedance at port 2 for the plane PCBs before adding the 1 nF decoupling capacitor. The dotted line represents the impedance after adding the capacitor. As shown, the peaking at 100 MHz was effectively suppressed. However, an impedance peak at ~50 MHz was generated due to the parallel combination of the capacitor and the plane. To further exacerbate the issue, this high impedance lied within the PSR peaking region of the LDO (FIG. 14).

Figure 18:
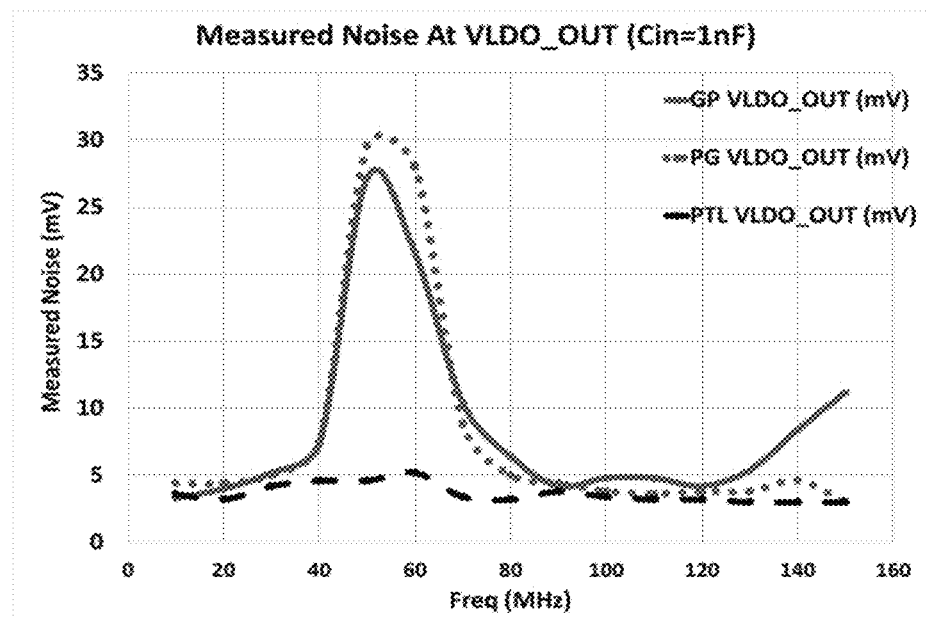
FIG. 18 is a graphical representation of a comparison of measured noise at LDO output when the noise source is ~100 mV P-P frequency from 10 MHz to 150 MHz and Cin Is 1 nF of PTL and planes according to an aspect of the present invention.

FIG. 18 shows the re-measured power supply noise at the LDO output after the addition of the 1 nF capacitor. The noise level used to peak at 100 MHz was successfully suppressed to below 5 mV peak-peak for the PG and GP PCBs as shown by the dotted line and solid line, respectively. Table IV compares the measured PSN at the LDO output at 100 MHz showing that it had been reduced by over 76% for both plane PCBs after adding the capacitor ($C_{IN}$).

The measured noise due to a 50 MHz stimulus as shown in Table V showed little improvement in the LDO output noise for the plane designs. However, the measured noise was very low at around 5 mV for the PTL PCB as indicated by the dash line in FIG. 18. Table V shows that the PTL PCB offered significant reduction in PSN (over 80%) after adding Cm as compared to the plane PCBs due to the lower impedance of the PDN at the LDO input.

The peak at around 38 MHz for the PTL PCB as indicated by the dash-dot line in FIG. 17 was out of the LDO PSR peaking region; therefore, posed no issues to power integrity.

TABLE IV

Measured Power Supply Noise at LDO Output with 100 MHz Input Noise Source Before and After Adding $C_{IN}$

| | PTL (mV) | GP (mV) | PG (mV) | Noise reduction over GP* | Noise reduction over PG* |
|---|---|---|---|---|---|
| No $C_{IN}$ | 4.4 | 20 | 21.2 | 78.0% | 79.2% |
| $C_{IN}$ = 1ηF | 3.4 | 4.8 | 3.8 | 29.2% | 10.5% |
| Noise reduction† | 22.7% | 76.0% | 82.1% | n/a | n/a |

*The noise reduction in PTL as compared to the corresponding test vehicle.
†Comparing the noise before and after adding $C_{IN}$

TABLE V

Measured Power Supply Noise at LDO Output with 50 MHz Input Noise Source at LDO Input Before and After Adding $C_{IN}$

| | PTL (mV) | GP (mV) | PG (mV) | Noise reduction over GP* | Noise reduction over PG* |
|---|---|---|---|---|---|
| No $C_{IN}$ | 7.0 | 24.0 | 30.4 | 70.8% | 77.0% |
| $C_{IN}$ = 1ηF | 4.6 | 27.2 | 29.6 | 83.1% | 84.5% |
| Noise reduction† | 34.3% | −13.3% | 2.6% | n/a | n/a |

D. MEASUREMENT UNDER ACTIVE LOAD

Figure 19:
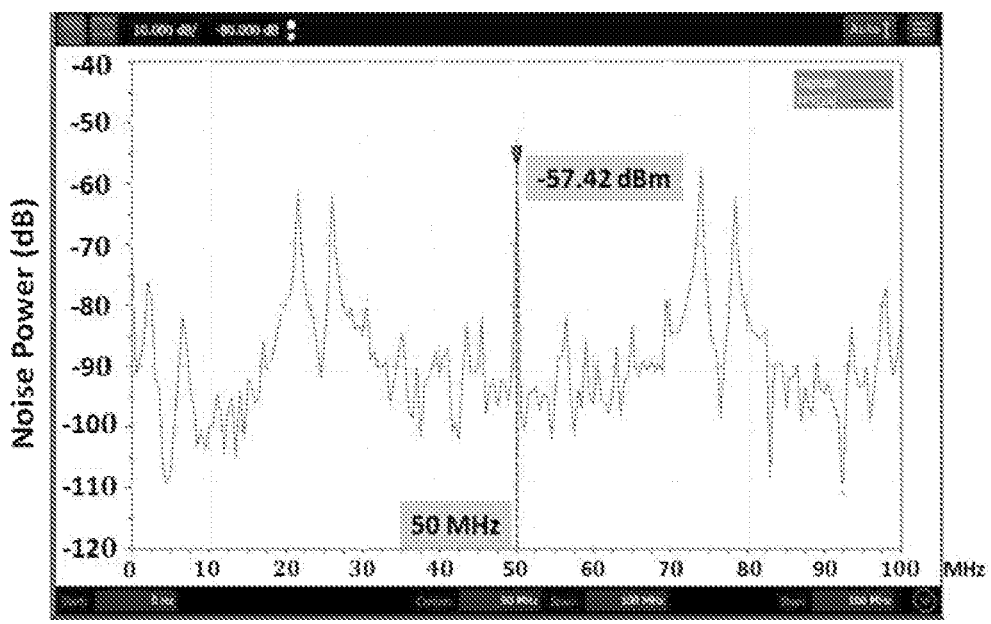
FIGS. 19-20 are graphical illustrations of measured power supply noise spectrum due to 50 MHz clock excitation at the LDO output (PTL PCB) and (GP-PCB) respectively according to aspects of the present invention.
Figure 20:
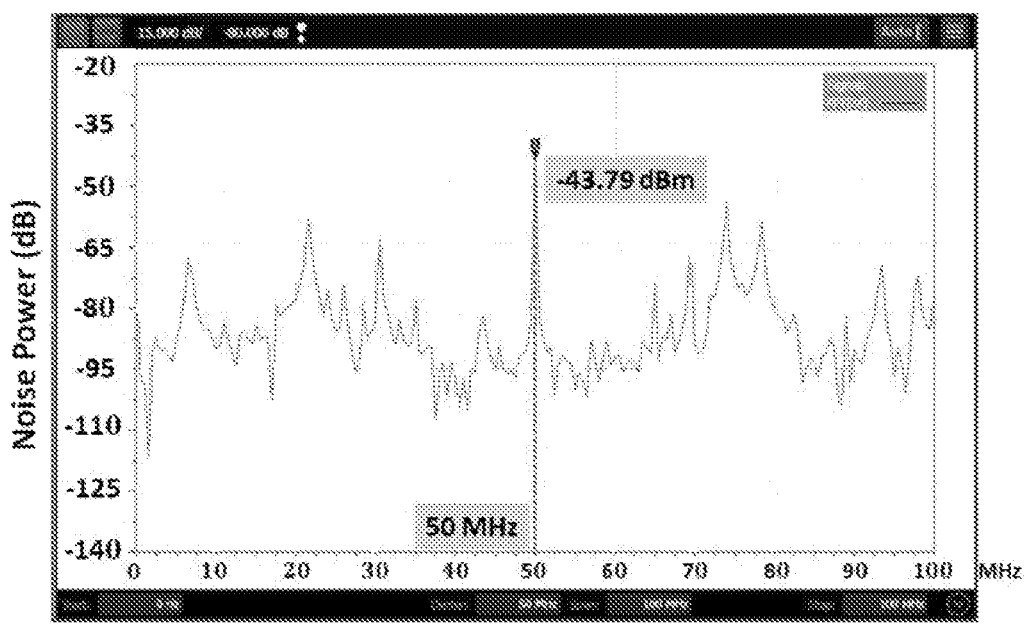

In subsequent testing, the 27Ω load resistor ($R_L$) was deactivated. Instead, the high speed buffer was utilized and was driven by a clock signal to create a dynamic load for the LDO, as shown in FIG. 12. The input and output signal ports of the buffer are marked in FIG. 12 and FIG. 11. The signaling method used at the output was pseudo single ended signaling. The output trace had four via transitions through the entire PCB. A 50 MHz clock signal was sent from a signal generator (Agilent 81133A) to the buffer. The spectrum of the power supply noise at the LDO chip output for the PTL PCB is shown in FIG. 19. The measured noise power was −57.42 dBm at 50 MHz. The noise power spectrum of the GP PCB was ~6 dB higher than the PTL PCB (−43.79 dBm), as shown in FIG. 20. The PG PCB had a much higher noise power at −14.98 dBm (not shown), which was in part due to the additional return path discontinuities at the SMA edge connectors on the input and output.

E. CONCLUSION

Due to the limited bandwidth of the internal regulating feedback loop and other parasitic effect, an LDO exhibits PSR peaking effect. Hence, its bandwidth to reject power supply noise from input to output is limited. The simulated LDO discussed above peaks in the 50 MHz region, which is typical. Traditionally, DC/DC converter and LDO are connected through voltage/ground planes and bulk/decoupling capacitors. However, the planes and capacitors can interact and create other impedance peaks such as shown in FIG. 17. Most of these high impedances occur in the frequency range of 40 MHz-100 MHz. In the simulated plane-based PDN, an impedance peak of ~99Ω occurred at the LDO input at ~50 MHz, which is in the same frequency region as the PSR peaking of the LDO. As a result, high power supply noise of 0.497V was observed at the LDO input and ~78% of which was coupled to the output due to ineffective noise rejection by the LDO.

A PTL as a conduit connected a DC/DC converter to an LDO. Unlike voltage and ground planes, which are 2D structures that facilitate standing wave resonances traveling along two dimensions, PTLs are 1D structures and hence the standing wave resonances occur only along a single dimension. The inductance of the PTL connected with a capacitor in parallel can be used to create a low impedance resonance null in the PSR peaking range. Therefore, LDO input sees minimal power supply noise. Although a PTL has higher DC resistance than solid planes, the numerical analysis and simulation shows that with significantly reduced noise at the input, the LDO dropout voltage can be eased thereby increasing the LDO energy conversion efficiency. This was realizable because the energy saved by reducing the LDO dropout voltage outweighs the energy consumed by the PTL by a significant amount. As discussed above, the LDO dropout voltage was lowered by 0.1V in the PTL case (Case 3) as compared to the plane case (Case 1). The overall efficiency increased by 12.1%, yet the power supply noise at the LDO output remained −98% lower than the plane case. This example shows that by co-designing LDO with PTL, optimization for both PSR and overall energy conversion efficiency can be done.

To show proof of concept three PCB test vehicles based on two different plane stack-ups and PTL PDN were built. A COTS LDO was used for PSR measurement which produced a PSR peaking in the region of ~50 MHz. An impedance peaking at 54 MHz in the plane based designs was observed after adding a 1 nF decoupling capacitor at the LDO input while the impedance of the PTL design remained low. Correspondingly, the measured power supply noise at the LDO output for the plane based designs was greater than 27 mV in the frequency region around 50 MHz. The PTL based design produced ~5 mV or lower of noise from 10 MHz to 150 MHz. This is a more than 83% reduction. When the LDO was connected to a dynamic load switching at 50 MHz, the noise power at the LDO output in the PTL test vehicle was ~6 dB lower than the plane based test vehicles. Therefore, we conclude that a system level, broadband, high noise rejection power delivery system is indeed achievable by using PTL in tandem with LDO to suppress power supply noise especially at the frequency band where LDO is ineffective due to PSR peaking.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention. To the extent necessary to understand or complete the disclosure of the present invention, all publications, patents, and patent applications mentioned herein are expressly incorporated by reference therein to the same extent as though each were individually so incorporated.

Having thus described exemplary embodiments of the present invention, those skilled in the art will appreciate that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A power delivery system for providing power to I/O circuits, the power system comprising:
   a. a power source;
   b. a voltage regulator module (VRM) connected to the power source;
   c. a low dropout voltage regulator (LDO) connected in series with the VRM, the LDO connected to the I/O circuits; and
   d. a single dimension power delivery network (PDN) comprising:
      i. a power transmission line (PTL); and
      ii. a reference plane that forms an uninterrupted return path with the PTL; and
   e. a capacitor,
   wherein the PTL with the capacitor are connected to and placed between the VRM and the LDO, connecting the LDO and VRM in series, the PTL causing a low impedance resonance null in a PSR peaking range of the LDO, leading to a minimal power supply noise at an input of the LDO without affecting the overall system level noise rejection performance, wherein the VRM and the LDO operate together at the same time, and wherein the combination of the VRM, LDO, and PDN allow the LDO to deliver clean power to the I/O circuits while maintaining energy efficiency.

2. The power delivery system of claim 1, wherein the LDO dropout voltage is reduced to increase the LDO energy conversion efficiency.

3. The power delivery system of claim 2, wherein the increase in the LDO energy conversion efficiency is done without affecting the overall system level noise rejection performance.

4. The power delivery system of claim 2, wherein controlling characteristics of the PTL and the capacitor can lead to a low impedance resonance null.

5. The power delivery system of claim 4, wherein the power transmission line comprises a micro-strip.

6. The power delivery system of claim 5, wherein the micro-strip comprises a thin power trace and a reference plane situated in an adjacent layer in a PCB or a package substrate stackup.

7. The power delivery system of claim 6, wherein the power trace delivers current while the reference plane serves as a current return path.

8. The power delivery system of claim 4, wherein the characteristics comprises resistance and inductance of the PTL and the capacitance of the capacitor.

9. The power delivery system of claim 8, wherein the resistance of the PTL can be controlled by manipulating the length and width of the PTL.

10. The power delivery system of claim 9, wherein the manipulation of the length and the width of the PTL is defined by $$R = \rho \frac{Len}{W \times T}$$

wherein R is resistance, ρ is the resistivity, W is width, Len is length, and T is the thickness of the PTL.

11. The power delivery system of claim 10, wherein R is defined by R=V/I, where V is the budgeted allowable voltage drop across the PTL and I is the load current through the PTL.

12. The power delivery system of claim 9, wherein the inductance of the PTL can be controlled by manipulating the width, length, and dielectric thickness of the PTL.

13. The power delivery system of claim 12, wherein the inductance (L), width (W), length (Len), and dielectric thickness (D) relationship is defined by $$L = 0.00508 * Len * \left(\ln\left(\frac{2 * Len}{W * D}\right) + 0.5 + 0.2235 * \left(\frac{W + D}{Len}\right)\right).$$

14. The power delivery system of claim 13, wherein the inductance (L) is determined by the location of the anti-resonance frequency.

15. The power system of claim 7, wherein the power trace and the PTL forms an uninterrupted current return path.

16. The power delivery system of claim 6, wherein the inductance of the PTL can further be controlled by manipulating spacing between the power trace and the reference plane.

17. A power delivery system for providing power to high-speed I/O circuits, the power system comprising:
  a. a power source;
  b. a voltage regulator module (VRM) connected to the power source;
  c. a low dropout voltage regulator (LDO) connected to the high-speed I/O circuits;
  d. a single dimension power delivery network (PDN) comprising:
    i. a power transmission line (PTL); and
    ii. a reference plane that forms an uninterrupted return path with the PTL; and
  e. a capacitor
  wherein the PTL with the capacitor are connected to and positioned between the VRM and the LDO, connecting the LDO and the VRM in series, the PTL causing a low impedance resonance null in a PSR peaking range of the LDO, leading to a minimal power supply noise at an input of the LDO without affecting the overall system level noise rejection performance as the VRM and LDO operate at the same time, allowing the LDO to provide power to the high-speed I/O circuits, wherein by manipulating the length and width of the PTL can control the resistance and inductance of the PTL.

* * * * *